United States Patent
Kuchiishi et al.

(10) Patent No.: US 7,113,740 B2
(45) Date of Patent: Sep. 26, 2006

(54) PORTABLE RADIO APPARATUS

(75) Inventors: Koji Kuchiishi, Kawasaki (JP); Yoji Inomata, Yokohama (JP); Toshihiro Higuchi, Kawasaki (JP); Hideo Haga, Yokohama (JP); Takashi Ishihara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 462 days.

(21) Appl. No.: 09/980,238

(22) PCT Filed: May 28, 2001

(86) PCT No.: PCT/JP01/02589

§ 371 (c)(1),
(2), (4) Date: Feb. 19, 2002

(87) PCT Pub. No.: WO01/76342

PCT Pub. Date: Oct. 11, 2001

(65) Prior Publication Data

US 2003/0013478 A1 Jan. 16, 2003

(30) Foreign Application Priority Data

Apr. 3, 2000 (JP) .............................. 2000-100876

(51) Int. Cl.
*H04H 1/00* (2006.01)
(52) U.S. Cl. .................... 455/3.06; 455/501; 455/63.1; 455/575.1; 455/575.4; 455/90.3; 381/189; 381/361

(58) Field of Classification Search .............. 455/3.06, 455/501, 67.1, 575.1, 575.4, 575.8, 90.3, 455/128, 271, 300, 301, 340; 381/189, 361
See application file for complete search history.

(56) References Cited

U.S. PATENT DOCUMENTS

| 4,419,770 | A | * | 12/1983 | Yagi et al. .................. 455/301 |
| 4,717,989 | A | | 1/1988 | De Barros et al. |
| 5,406,038 | A | * | 4/1995 | Reiff et al. .................. 181/167 |
| 5,588,041 | A | * | 12/1996 | Meyer et al. ............ 455/569.2 |
| 5,796,854 | A | * | 8/1998 | Markow ..................... 381/385 |
| 5,844,166 | A | * | 12/1998 | Halttunen et al. ........ 174/35 R |
| 6,321,070 | B1 | * | 11/2001 | Clark et al. .............. 455/575.1 |

FOREIGN PATENT DOCUMENTS

| EP | 909 077 A2 | 4/1999 |
| EP | 0 963 148 | 12/1999 |
| GB | 0963148 A2 | * 12/1999 |
| JP | 01221099 A | * 9/1989 |

\* cited by examiner

*Primary Examiner*—Matthew Anderson
*Assistant Examiner*—Minh Dao
(74) *Attorney, Agent, or Firm*—Pearne & Gordon LLP

(57) ABSTRACT

A portable radio apparatus has a radio circuit (9) provided on a printed circuit board (5), a speaker (8) provided on a rear cover (2), and a shield case (10) provided to cover the radio circuit (9). In the shield case (10), ventilation holes (10A) having a size that does not affect the shielding performance are provided in close proximity of the rear of the speaker (8).

7 Claims, 1 Drawing Sheet

PORTABLE RADIO APPARATUS

This application claims the benefit of International Application Number PCT/JP01/02589, which was published in English on Oct. 11, 2001.

TECHNICAL FIELD

The present invention relates to portable radio apparatus such as a portable telephone set, and in particular to a portable radio apparatus with improved sound quality of a speaker.

BACKGROUND ART

In portable radio apparatus such as a portable telephone set, the casing is getting more and more compact and low-profile in order to enhance portability. Thus, efforts have been made to install in high density a radio circuit, a speaker, a receiver, and an LCD (Liquid Crystal Display) module in a limited space within the casing.

In general, a speaker is easier to vibrate when the volume of a space present at the rear of the speaker is larger. In the portable telephone set, it is difficult to reserve a sufficient space at the rear of the speaker because of the high-density install; as a result, full performance of a speaker cannot be obtained.

It is requested to prevent an electromagnetic wave from generating a noise in the speaker.

The inventions has been proposed to solve such problems and aims at providing a portable radio apparatus that prevents propagation of an electromagnetic wave from a radio circuit to a speaker and improves sound quality of a speaker.

DISCLOSURE OF INVENTION

Portable radio apparatus according to the invention is portable radio apparatus comprising a radio circuit, a speaker, and a shield member for electromagnetically shielding the radio circuit from the speaker, characterized in that the shield member is provided with ventilation holes having a size that does not affect the shielding performance. Via this configuration, it is possible to let air compressed by the vibration at the rear of the speaker to pass through ventilation holes without reducing the shielding performance inherent to the shield member. Thus it is possible to prevent propagation of an electromagnetic wave from a radio circuit to a speaker and improve the sound quality of the speaker.

BEST MODE FOR CARRYING OUT THE INVENTION

Embodiments of the invention will be detailed with reference to the drawings. In the following description, the section of a portable radio apparatus positioned upward when the portable radio apparatus is used is assumed as the upper section of the portable radio apparatus.

FIRST EMBODIMENT

Figure 1:
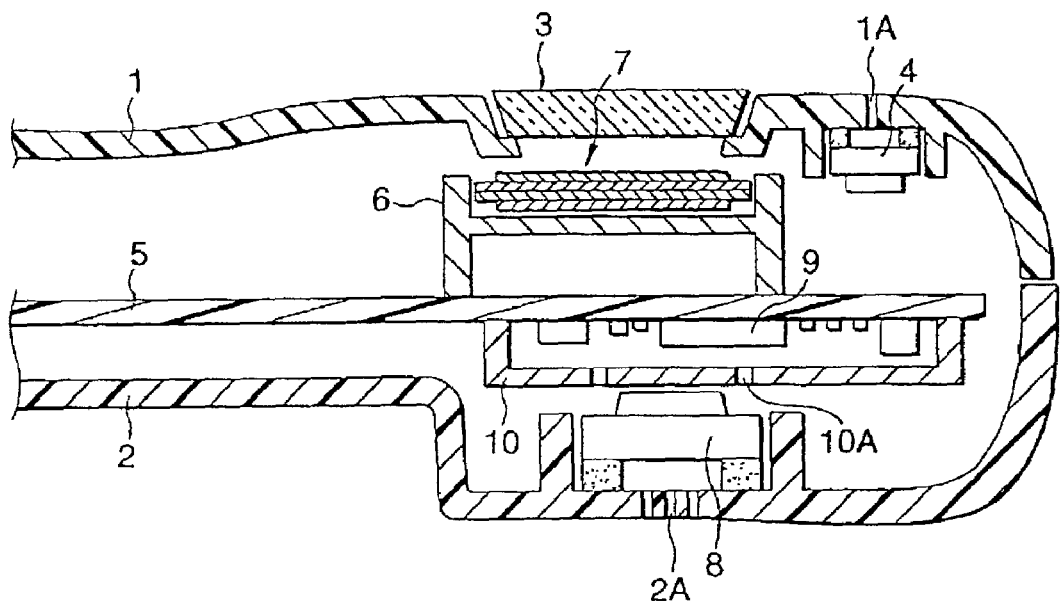
FIG. 1 is an internal structure of portable radio apparatus according to a first embodiment of the invention.

FIG. 1 is a cross-sectional view of the internal structure of the section above the approximate center of portable radio apparatus according to a first embodiment of the invention.

The portable radio apparatus comprises a front cover 1 and a rear cover 2 as a casing. On top of the front cover 1 is provided an opening, where a transparent panel 3 for liquid display is fixed. In close proximity of the upper end of the front cover 1, a receiver sound hole 1A is provided. At the position on the inner surface of the front cover 1 corresponding to the receiver sound hole 1A, a receiver 4 is fixed via a cushion. On top of the rear cover 2, a plurality of speaker sound holes 2A are provided. At the position on the inner surface of the rear cover 2 corresponding to the speaker sound holes 2A, a speaker 8 is fixed.

Within the casing composed of the front cover 1 and the rear cover 2, a printed circuit board 5 is provided. On the upper face of the printed circuit board 5, an LCD holder 6, which holds an LCD module 7 is provided. On the lower face of the printed circuit board 5, a radio circuit 9 is mounted. Further, a shield case having a shape to cover the radio circuit 9 is provided. In close proximity of the position at the bottom of the shield case 10 that is opposite to the rear of the speaker 8, a plurality of ventilation holes 10A are provided. The size of a ventilation hole 10A is specified so as not to affect the performance of shielding an electromagnetic wave radiated from the radio circuit 9. The size is specified depending on the use frequency of a portable telephone set.

In portable radio apparatus having the above configuration, vibration of the speaker 8 is propagated via a rear sound hole (not shown). Air compressed by the vibration of the speaker 8 is propagated around from the rear of the speaker 8. Part of the compressed air passes through the ventilation holes 10A on the shield case 10 and reaches the space within the shield case 10. Providing ventilation holes 10A in the shield case 10 allows the space in the shield case 10 to be used for upgrading the sound quality of the speaker 8.

An electromagnetic wave radiated from the radio circuit 9 is shielded by the shield case 10 and never leaks out of the shield case 10. Thus, a noise, caused by that the electromagnetic wave radiated from the radio circuit 9 reaches the speaker 8, is not generated.

In this way, in portable radio apparatus according to the first embodiment of the invention, a shield case 10 is disposed to cover the radio circuit 9 and ventilation holes 10A having a size that does not affect the shielding performance are provided on the face that is opposite to the rear of the speaker 8. This improves the sound quality of the speaker 8 and prevents propagation of an electromagnetic wave from the radio circuit to the speaker 8.

SECOND EMBODIMENT

Figure 2:
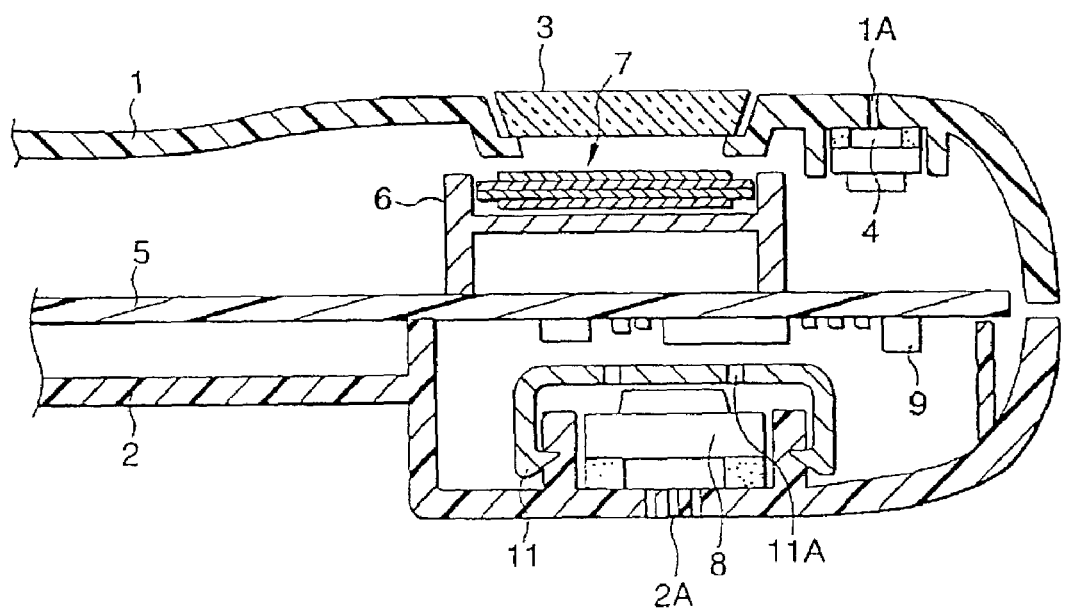
FIG. 2 is an internal structure of portable radio apparatus according to a second embodiment of the invention.

FIG. 2 is a cross-sectional view of the internal structure of the section above the approximate center of portable radio apparatus according to a second embodiment of the invention. The same components as those in FIG. 1 are given the same signs and the corresponding description is omitted.

In this embodiment, a holder 11 having a shield feature is provided instead of a shield case 10 in the first embodiment. The holder 11 has a surface composed of for example a metallized resin to shield the speaker 8 from an electromagnetic wave radiated from the radio circuit 9. The holder 11 has a shape that to cover the rear and sides of the speaker 8.

In close proximity of the rear of the speaker 8, ventilation holes 11A having a size that does not affect the performance of shielding an electromagnetic wave radiated from the radio circuit 9 are provided. Metallizing a section on the inner surface of the rear cover 2 that faces the radio circuit 9 prevents the electromagnetic wave radiated from the radio circuit 9 from leaking out of the rear cover 2. Configuration of the other sections is the same as the first embodiment.

In portable radio apparatus having the above configuration, vibration of the speaker 8 is propagated via a rear sound hole (not shown). Air compressed by the vibration of the speaker 8 is propagated around from the rear of the speaker 8. The compressed air passes through the ventilation holes 11A in the holder 11 and is propagated in the surrounding space. Thus, the space around the holder 11 can be used to improve the sound quality of the speaker 8.

Since the speaker 8 is shielded by the holder 11, the electromagnetic wave radiated from the radio circuit 9 never reaches the speaker 8 nor generates a noise. The electromagnetic wave radiated from the radio circuit 9 and propagated to the inner surface of the rear cover 2 is reflected on the metallized inner surface and never leaks out of the rear cover 2.

In this way, portable radio apparatus according to the second embodiment of the invention is provided with a holder 11 that has a shape to cover the rear and sides of the speaker 8 and ventilation holes 11A that do not affect the performance of shielding an electromagnetic wave radiated from the radio circuit 9 in close proximity of the rear of the speaker 8. This improves the sound quality of the speaker 8 and prevents propagation of an electromagnetic wave from the radio circuit to the speaker 8.

INDUSTRIAL APPLICABILITY

As mentioned earlier, the portable radio apparatus according to the invention has excellent advantages that propagation of an electromagnetic wave from a radio circuit to a speaker is prevented and the sound quality of the speaker is improved, by providing ventilation holes in a shield member for electromagnetically shielding the radio circuit from the speaker, said ventilation holes having a size that does not affect the shielding performance.

The invention claimed is:

1. A portable radio apparatus comprising:
   a radio circuit;
   a speaker; and
   a shield member for electromagnetically shielding the radio circuit from the speaker,
   wherein the shield member includes at least one ventilation hole having a size that does not affect the shielding performance, and
   wherein the ventilation hole is provided in close proximity and opposite of a sound hole at a rear of the speaker,
   wherein the size of the ventilation hole is specified so as to shield the speaker from an electromagnetic wave radiated from the radio circuit, which is the radio use frequency of the portable radio apparatus.

2. A portable radio apparatus according to claim 1, wherein the shield member is a shield case disposed to cover the radio circuit.

3. A portable radio apparatus according to claim 1, wherein the shield member is a holder having a shape to cover the rear and sides of the speaker.

4. A portable radio apparatus comprising:
   a radio circuit;
   a speaker; and
   a shield case disposed to cover the radio circuit for electromagnetically shielding the radio circuit from the speaker,
   wherein the shield case includes at least one ventilation hole having a size that does not affect the shielding performance, said ventilation hole provided on a face of the shield case in close proximity and opposite to a rear of the speaker, and
   wherein compressed air by the vibration of the speaker passes through the ventilation hole and propagates in a space enclosed by the shield case.

5. A portable radio apparatus comprising:
   a radio circuit;
   a speaker; and
   a holder having a shape to cover a rear and sides of the speaker for electromagnetically shielding the radio circuit from the speaker,
   wherein the holder includes at least one ventilation hole having a size that does not affect the shielding performance, said ventilation hole provided on a face of the shield holder in close proximity and opposite to a rear of the speaker, and
   wherein compressed air by the vibration of the speaker passes through the ventilation hole and propagates in a space enclosed around the holder.

6. A portable radio apparatus comprising:
   a radio circuit;
   a speaker; and
   a shield member for electromagnetically shielding the radio circuit from the speaker,
   wherein the shield member includes at least one ventilation hole having a size that does not affect the shielding performance, and
   wherein the ventilation hole is provided in close proximity and opposite of a sound hole at a rear of the speaker,
   wherein air compressed by vibration of the speaker is propagated around from the rear of the speaker and a part of the compressed air passes through the ventilation hole on the shield member reaching the space within the shield member which includes the radio circuit and allowing the space within the shield member to be used for upgrading sound quality of the speaker.

7. A portable radio apparatus comprising:
   a radio circuit;
   a speaker; and
   a shield member for electromagnetically shielding the radio circuit from the speaker,
   wherein the shield member includes at least one ventilation hole having a size that does not affect the shielding performance, and
   wherein the ventilation hole is provided in close proximity and opposite of a sound hole at a rear of the speaker.
   wherein air compressed by vibration of the speaker is propagated around from the rear of the speaker and passes through the ventilation hole on the shield member reaching the space around the shield member which includes the radio circuit and allowing the space around the shield member to be used for upgrading sound quality of the speaker.

* * * * *